(12) United States Patent
Ray et al.

(10) Patent No.: US 6,291,134 B1
(45) Date of Patent: Sep. 18, 2001

(54) LITHOGRAPHIC PLATE PRECURSOR

(75) Inventors: Kevin Barry Ray, Leeds; Alison Jane Brooks, West Yorkshire; Gareth Rhodri Parsons, Leeds; Deborah Jane Firth, deceased, late of Leeds, all of (GB), by legal representative Herbert S. Firth; Christopher David McCullough, Fort Collins, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/347,848

(22) Filed: Jul. 8, 1999

Related U.S. Application Data

(63) Continuation of application No. PCT/GB98/00133, filed on Jan. 15, 1998.

(30) Foreign Application Priority Data

Jan. 17, 1997 (GB) .................................................... 970088

(51) Int. Cl.$^7$ ........................................................ G03F 7/30
(52) U.S. Cl. ......................... 430/302; 430/168; 430/175
(58) Field of Search .................................. 430/175, 302, 430/168

(56) References Cited

U.S. PATENT DOCUMENTS

| | | | |
|---|---|---|---|
| 3,997,349 | 12/1976 | Sanders | 96/75 |
| 4,215,041 | 7/1980 | Phlipot et al. | 260/141 |
| 4,581,313 | 4/1986 | Minamizono et al. | 430/175 |
| 5,112,743 | 5/1992 | Kamiya et al. | 430/175 |
| 5,741,619 | * 4/1998 | Aoshima et al. | 430/175 |
| 6,096,481 | * 8/2000 | Vermeersch et al. | 430/302 |
| 6,114,083 | * 9/2000 | Kawamura et al. | 430/270.1 |

FOREIGN PATENT DOCUMENTS

| | | |
|---|---|---|
| 2524652 | 12/1976 | (DE) . |
| 0237574 | 8/1986 | (EP) . |
| 0599900 | 7/1992 | (EP) . |
| 0530815 | 9/1992 | (EP) . |
| 0768172 | 10/1995 | (EP) . |
| 0778499 | 12/1995 | (EP) . |
| 0769724 | 2/1996 | (EP) . |
| 2284684 | 6/1995 | (GB) . |
| WO9831545 | 7/1998 | (WO) . |
| WO9900703 | 1/1999 | (WO) . |

OTHER PUBLICATIONS

J. Kosar, "Light Sensitive Systems", published 1965, Wiley, pp. 323–325.

* cited by examiner

*Primary Examiner*—John S. Chu
(74) *Attorney, Agent, or Firm*—Baker Botts L.L.P.

(57) ABSTRACT

There is described a method of preparing a lithographic plate which comprises coating on a lithographic support having a hydrophilic surface a layer of a radiation sensitive coating, imaging the coating then acting on the plate while on the press with aqueous fount solution to remove the unexposed areas of the coating, to reveal the hydrophilic surface of the plate and to leave an ink receptive image, wherein the radiation sensitive coating comprises a diazo salt of formula (I):

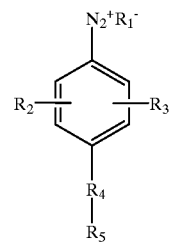

wherein $R_1$ is an anion, $R_2$ and $R_3$ represent optional substitution, $R_4$ is —N— and —S— and $R_5$ is a group which, after exposure of the plate renders the residue of the diazo salt oleophilic and fount solution insoluble.

10 Claims, No Drawings

LITHOGRAPHIC PLATE PRECURSOR

This is a continuation of copending application Ser. No. PCT/GB98/00133 filed Jan. 15. 1998, which is incorporated herein by reference.

This invention relates to a lithographic plate precursor which can be processed on press.

BACKGROUND OF THE INVENTION

Currently the commonest method of preparing a lithographic plate is to image a photosensitive lithographic plate using an image mask, such as a photographic negative, and to prepare the plate therefrom using an aqueous developing solution. This procedure is time consuming and requires facilities and equipment to support the necessary chemistry.

Thus recently various methods have been proposed for preparing lithographic plates on the press which is to be used to produce prints from the plate. These methods prepare the image using a digitally controlled laser image head. As described in European Patent Application 580393 such methods include ink-jet methods digitally controlled, spark-discharge methods and the production of electromagnetic-radiation pulses that create chemical changes of the plate blank. Also etching methods have been described as well as blank plates which are ablated by the laser to form an ink-receptive image. But such methods require expensive apparatus.

SUMMARY OF THE INVENTION

We have discovered a method of processing a lithographic plate precursor wherein the plate is processed whilst on the press.

According to the present invention there is provided a method of preparing a lithographic plate which comprises coating on a metal plate having a hydrophilic surface a layer of a radiation sensitive coating, imaging the coating then acting on the plate whilst on the press with aqueous fount solution to remove the unexposed areas of the coating to reveal the hydrophilic surface of the plate and to leave an ink receptive image, wherein the radiation sensitive coating comprises a diazo salt of the following formula:

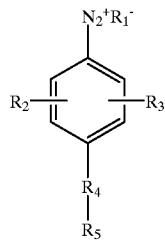

wherein $R_1$ is an anion, $R_2$ and $R_3$ represent optional substitution, $R_4$ is —N— or —S— and $R_5$ is a group which after exposure of the plate renders the residue of the diazo salt oleophilic and fount insoluble.

Usefully $R_1$ is sulphate, nitrate or chloride or it may be a more complex anion for example perfluorooctyl. $R_2$ and $R_3$ if present are preferably selected from the alkoxy, halogen, alkyl or amine. The presence of a substituent group in $R_2$ or $R_3$ helps to stabilize the diazo compound.

When $R_4$ is —N— it may be represented by

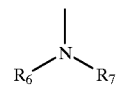

where $R_7$ and $R_6$ may be part of a polymer chain or may be part of a morpholino functional group.

Preferably however $R_6$ is hydrogen and $R_7$ is a group

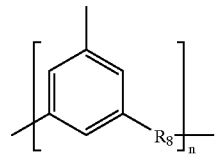

where $R_8$ is the residue of a condensing agent and n is 1 to 100. Thus the groups $R_7$ converts the diazo compound to a diazo resin and this helps to prevent the exposed diazo from washing off during processing.

Examples of diazo salts used in the examples which follow are:

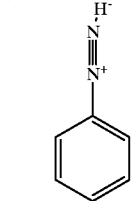
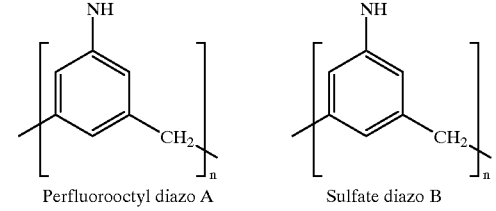

Perfluorooctyl diazo A    Sulfate diazo B and

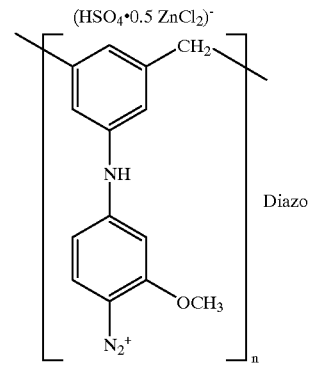

Diazo C

The plate whilst on the press may have fount solution applied to it by a sponge or a cloth. Preferably however the dampening roller of the press applies it. In this case printing ink may be applied to the plate at the same time.

The plate may be imaged on a lightframe using U.V. light. Preferably it is imaged using a digital laser imaging head which comprises a laser which scans in an imagewise manner across the plate.

The laser may be one which emits in the UV region; diazo salts being naturally sensitive to UV light. However preferably the laser emits at above 800 nm and the diazo coating composition comprises an infra-red absorbing compound.

Preferably the infra-red absorbing compound is one whose absorption spectrum is significant at the wavelength output of the laser which is to be used. For example gallium arsenide diode lasers emit at 830 mn and Nd YAG lasers emit at 1064 nm.

Preferably the digital laser imaging head is in essence an image setter attached to the printing press.

Several types of support can be used for the manufacturing of a diazo sensitised lithographic printing plate. Common supports are metal supports like Al or Zn, polyester film supports and paper bases. These supports if not sufficiently hydrophilic by themselves, are first coated with a hydrophilic layer to form the background of the printing plate and a top layer containing the diazo compound is then applied.

The lithographic support may be a flexible support which can be attached to the printing press. However preferably the lithographic support is a metal sleeve or cylinder which has a hydrophilic surface and which forms part of the printing surface of a printing press.

Thus in the preferred method of the present invention a metal sleeve or cylinder which has a hydrophilic surface and which forms part of the printing surface of a printing press is coated with a diazo coating solution, the metal sleeve is disengaged from the roller drive of the printing press and is caused to rotate at a speed suitable for imaging, the digital laser head attached to the printing press images the diazo layer on the metal sleeve, after imaging the metal sleeve is re-engaged to the roller drive of the printing press and the rollers of the press rotate and act as fount-dampening rollers, thus removing the unexposed areas of the diazo on the surface of the sleeve and to reveal the hydrophilic surface of the sleeve in the unexposed areas of the sleeve, the rollers of the press are then inked up and the printing press prints onto paper fed to it. After the print run has finished a plate washer can be employed to remove all the coating from the sleeve which can then be re-used.

Preferably the metal sleeve can be removed from the press to clean it thoroughly and also to renew it periodically.

In a modification to the method of the present invention there is present between the hydrophilic surface of the metal sleeve and the dried diazo coating solution a hydrophilic layer. It helps the fount solution to remove the unexposed diazo coating more cleanly after the imagewise exposure. Also the presence of the layer makes it easier to thermally image the diazo layer.

Examples of such hydrophilic layers are layers composed of hydrophilic polysaccharides for example dextran or pullulan.

DETAILED DESCRIPTION OF THE INVENTION

The following examples will serve to illustrate the invention.

EXAMPLE 1

A solution containing 0.5 g of Diazo resin (Diazo B) sulphate and 0.95 g water:methanol (80:20) was prepared and coated onto a Horsell standard grained/anodised aluminum plate using a bar coating technique.

This was then dried at 80° C. for 2 minutes in an oven and gave a coating film weight of 0.6 $gm^{-2}$. The plate was imaged to U.V. light using a Montakop light frame at 200 units and 50:50 vacuum (with a stouffer wedge). Approximately 50 mls of fount solution was then applied to the plate and rubbed gently with cotton wool for 1 minute. Rapid ink was then applied (no removal of fount).

Assessment was made of the stouffer reading and any background staining. Using a Stouffer Wedge the readings were: Solid 1, Slight trace 11

A similar test was carried out using the same quantity of the perfluorooctyl diazo (diazo A) instead of the sulphate diazo (diazo B).

Using a Stouffer Wedge the readings were: Solid 11, Slight Trace 17. In both cases when the plates were inked up over 5000 copies were obtained before background staining occurred.

EXAMPLE 2

Laser Imaged

The diazo compound used was diazo C.
The I.R. dye used had the formula:

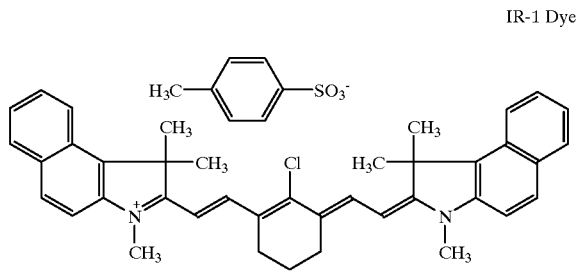

IR-1 Dye

A binder ROC15 was present of the formula:

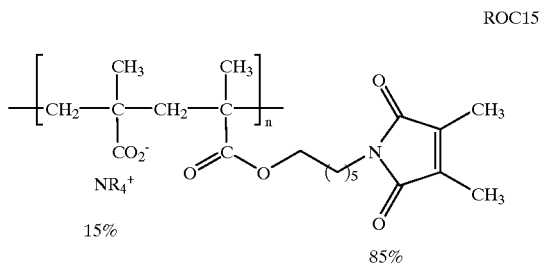

ROC15

A solution containing 0.88 g of an ROC15 resin solution at 40% (w/w) in methoxypropanol 1.79 g of a 5% (w/w) diazo C solution in water, 0.02 g of IR dye 1, 7.07 g of methoxypropanol and 0.24 g of water was prepared and coated onto a substrate consisting of a sheet of aluminum that had been electrograined and anodised and given a coating film weight of 1.3 $gm^3$ after drying at 80° C. in an oven for 2 minutes.

The coated substrate to be imaged was cut into a circle of 105 mm diameter and placed on a disc that could be rotated at a constant speed of 2500 revolutions per minute. Adjacent to the spinning disc a translating table held the source of the laser beam so that the laser beam impinged normal to the coated substrate, while the translating table moved the laser beam radially in a linear fashion with respect to the spinning disk. The exposed image was in the form of a spiral whereby the image in the centre of the spiral represented slow laser scanning speed and long exposure time and the outer edge of the spiral represented fast scanning speed and short exposure time. The laser used was a single mode 830 nm wavelength 200 mW laser diode which was focused to a 10 micron spot. The laser power supply was a stabilised constant current source.

The exposed plate was then rubbed with a cotton wool swab with printing ink and fount solution applied which removed the parts of the coating on the plate that were not struck by the laser beam giving an image. The imaging energy density required to give a suitable image was 500 mJcm$^{-2}$.

EXAMPLE 3

Laser Imaged

A printing plate made according to example 2 was also imaged on a commercially available image setter, the Trendsetter, supplied by Creo Products of Vancouver, Canada. The imaging energy density required to give a suitable image was 500 mJcm$^{-2}$.

As the invention relies on a heating process, any suitable light of sufficient power and which is suitably absorbed by components in the system to generate heat in the composition, may be used.

Comparative

A solution containing 0.88 g of an ROC15 resin solution at 40% (w/w) in methoxypropanol 1.79 g of a 5% (w/w) diazo C solution in water, 7.07 g of methoxypropanol and 0.24 g of water was prepared and coated onto a substrate consisting of a sheet of aluminum that had been electrograined and anodised and given a coating film weight of 1.3 gm$^3$ after drying at 80° C. in an oven for 2 minutes.

The resulting plate was imaged using a 200 mW laser diode at a wavelength of 830 nm using the imaging device described previously. The plate was then rubbed with a cotton wool swab with printing ink and fount solution applied. This process removed the parts of the coating that had not reacted by being struck with the laser beam. As no image remained on the plate, the imaging reaction had not taken place.

What is claimed is:

1. A method of preparing a lithographic plate which comprises a layer of a radiation sensitive coating on a support having a hydrophilic surface, the method comprising digitally imaging the coating with a laser which emits light having a wavelength above 800 nm, then acting on the plate while the plate is on a printing press with aqueous fount solution to remove the unexposed areas of the coating to reveal the hydrophilic surface of the plate and to leave an ink receptive image, wherein the radiation sensitive coating comprises an infra-red absorbing compound and a diazo salt of the following formula:

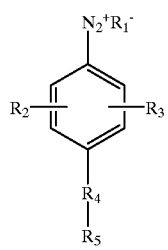

wherein $R_1$ is an anion, $R_2$ and $R_3$ represent optional substitution, $R_4$ is —N— or —S— and $R_5$ is a group which after exposure of the plate renders the residue of the diazo salt oleophilic and fount insoluble.

2. The method according to claim 1 wherein $R_1$ is sulphate, nitrate, chloride or perfluorooctyl.

3. The method according to claim 1 wherein $R_2$ and $R_3$ when present are selected from alkoxy, halogen, alkyl or amine.

4. The method according to claim 1 wherein when $R_4$ is —N— the moiety —$R_4$—$R_5$ is of the formula:

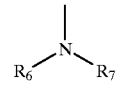

where $R_7$ and $R_6$ are part of a polymer chain or are part of a morpholino functional group.

5. The method according to claim 1 wherein when $R_4$ is —N— the moiety —$R_4$—$R_5$ is of the formula:

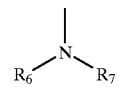

where $R_6$ is hydrogen and $R_7$ is a group having the formula

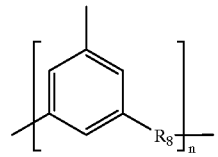

where $R_8$ is the residue of a condensing agent and n is 1 to 100.

6. The method according to claim 1 wherein the support is a metal sleeve or cylinder which has a hydrophilic surface and which forms part of the printing surface of the printing press.

7. The method according to claim 1, wherein the coating is imaged to cause image-wise heating thereof.

8. The method according to claim 1, further comprising a digital laser imaging head which is an image setter attached to the printing press.

9. The method according to claim 1, wherein the support comprises a metal support, a polyester film support or a paper base.

10. The method according to claim 6 wherein the metal sleeve or cylinder which has a hydrophilic surface and which forms part of the printing surface of the printing press is coated with a diazo coating solution, the printing press has a roller drive and rollers, the metal sleeve is disengaged from the roller drive of the printing press and is caused to rotate at a speed suitable for imaging, a digital laser head attached to the printing press images the diazo layer on the metal sleeve, after imaging the metal sleeve is re-engaged to the roller drive of the printing press and the rollers of the press rotate and act as fount-dampening rollers, thus removing the unexposed areas of the diazo on the surface of the sleeve and revealing the hydrophilic surface of the sleeve in the unexposed areas of the sleeve, and the rollers are then inked up, paper is fed to the printing press and the printing press prints onto the paper.

* * * * *

UNITED STATES PATENT AND TRADEMARK OFFICE
CERTIFICATE OF CORRECTION

PATENT NO.     : 6,291,134 B1
DATED          : September 18, 2001
INVENTOR(S)    : Ray et al.

It is certified that error appears in the above-identified patent and that said Letters Patent is hereby corrected as shown below:

Column 4,
Line 1, "stouffer" should read -- Stouffer --
Line 5, "stouffer" should read -- Stouffer --
Line 53, "gm$^3$" should read -- g/m$^2$ --

Column 5,
Line 27, "gm$^3$" should read -- g/m$^2$ --
Line 66, "sulphate" should read -- sulfate --

Signed and Sealed this

Twenty-seventh Day of August, 2002

Attest:

*Attesting Officer*

JAMES E. ROGAN
*Director of the United States Patent and Trademark Office*